(12) United States Patent
Smith

(10) Patent No.: US 7,173,493 B1
(45) Date of Patent: Feb. 6, 2007

(54) RANGE CONTROLLER CIRCUIT AND METHOD

(75) Inventor: Keith Noel Smith, Cork (IE)

(73) Assignee: Cypress Semiconductor Corp., San Jose, CA (US)

( * ) Notice: Subject to any disclaimer, the term of this patent is extended or adjusted under 35 U.S.C. 154(b) by 245 days.

(21) Appl. No.: 11/001,992

(22) Filed: Dec. 2, 2004

Related U.S. Application Data

(60) Provisional application No. 60/531,009, filed on Dec. 19, 2003.

(51) Int. Cl.
*H03L 7/087* (2006.01)

(52) U.S. Cl. .......................... 331/11; 331/1 A; 331/18; 331/23; 331/179

(58) Field of Classification Search ................ 331/1 A, 331/10, 11, 18, 23, 25, 179; 327/156–159; 332/127; 360/51; 375/376; 455/260
See application file for complete search history.

(56) References Cited

U.S. PATENT DOCUMENTS 5,487,093 A * 1/1996 Adresen et al. ............. 375/376

* cited by examiner

*Primary Examiner*—David Mis
(74) *Attorney, Agent, or Firm*—Dale B. Halling

(57) ABSTRACT

A range controller circuit has a master counter with a recovered clock input. A sampled counter has a reference clock input. A link fault indicator logic is coupled to an output of the master counter and an output the sampled counter.

20 Claims, 2 Drawing Sheets

RANGE CONTROLLER CIRCUIT AND METHOD

RELATED APPLICATIONS

The present invention claims priority on provisional patent application Ser. No. 60/531,009, filed on Dec. 19, 2003, entitled "Range Controller Scheme with Reference Clock Detection".

FIELD OF THE INVENTION

The present invention relates generally to the field of electronic circuits and more particularly to a range controller circuit and method.

BACKGROUND OF THE INVENTION

Range controller circuits are used to monitor the frequency of a clock generated by a phase lock loop (PLL). A range controller circuit ensures that the phase lock loop has an output clock with a frequency within an acceptable range. Typical range controller circuits have a reference clock that is compared to the recovered clock from the phase lock loop. The range controller has a master counter coupled to reference clock and a sample counter coupled to the recovered clock. When the difference between these two counters is too large, a link fault indicator flag is set. One problem with typical range controllers is that the latch for the link fault indicator signal is clocked by the reference clock. If the reference clock is unavailable, the link fault indicator signal does not latch. As a result, the range controller may indicate an incorrect status for the link.

Thus there exists a need for a range controller that does not require the reference clock to be active to provide accurate state information.

SUMMARY OF INVENTION

A range controller circuit that overcomes these and other problems has a master counter with a recovered clock input. A sampled counter has a reference clock input. A link fault indicator logic is coupled to an output of the master counter and an output the sampled counter. The link fault indicator logic may have a reference clock presence indicator signal. A reference clock presence indicator signal may be an output of a reference clock watchdog flip flop that is clocked by the recovered clock. The link fault indicator logic may include a handshake logic circuit. An output of the handshake logic circuit may be coupled to a recovered clock flip flop. The handshake logic circuit may have a first input of a recovered clock reset count signal. The handshake logic circuit may have a second input of a reference clock reset count' signal. An input, rxPLL powerdown, will override the actions of the logic and reset the outputs of the link fault indicator and reference clock watchdog.

In one embodiment, a method of operating a range controller includes the steps of counting a recovered clock signal to form a recovered count. A reference clock signal is counted to form a reference count. When the recovered count is equal to a first number, the recovered count is compared to the reference count. When the recovered count is equal to a second number that is greater than the first number, a reset count signal is transmitted to a reset circuit for the reference count. When the reference reset signal is not detected by a third number of counts after the reset count signal, a reference clock watchdog flag is set. When the recovered count differs from the reference count by more than a predetermined number of counts, a link fault indicator flag is set. The link fault indicator flag is clocked using the recovered clock signal.

In one embodiment, a range controller circuit has a master counter with an input coupled to a recovered clock. A link fault indicator logic is coupled to an output of the master counter. A link fault indicator signal of the link fault indicator logic is clocked by the recovered clock. A sampled counter may have an input coupled to a reference clock. The link fault indicator logic may have a reference clock watchdog signal output. The link fault indicator logic may have a handshake logic circuit coupled between the master counter and the reference clock. The link fault indicator logic may have an inner window logic circuit and an outer window logic circuit. An output of the handshake logic circuit is coupled to a reference clock watchdog flip flop. The reference clock watchdog flip flop may be clocked by the recovered clock.

DETAILED DESCRIPTION OF THE DRAWINGS

A range controller has a master counter coupled to a recovered clock. The recovered clock is used to clock the link fault indicator signal's status. Since the recovered clock almost always is running once it is acquired, there is almost no chance that a change in the status of the link fault indicator signal will not be latched. In addition, the range controller described herein has a new signal, a reference clock watchdog signal that indicates if the reference clock is not being received.

Figure 1:
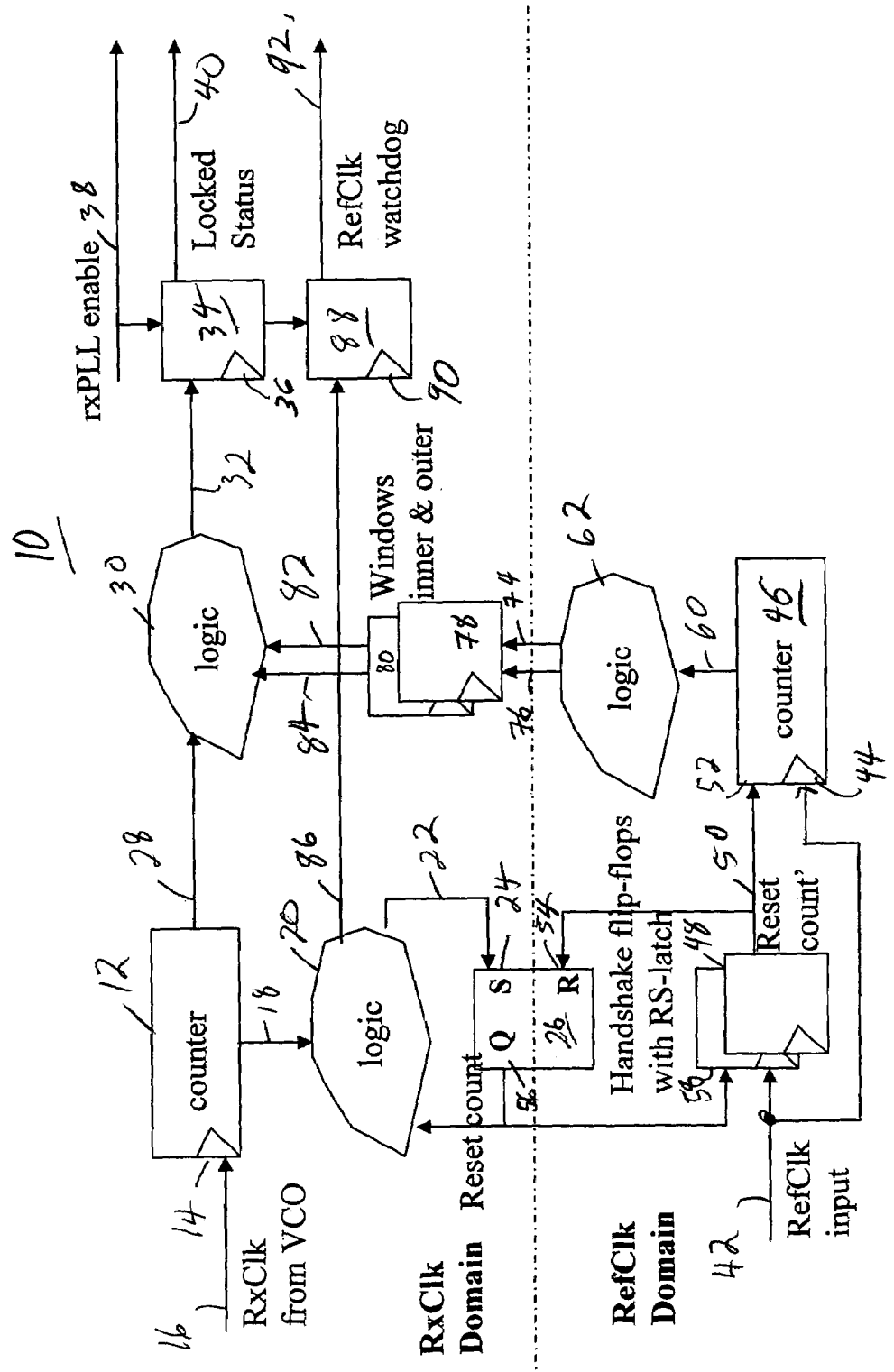
FIG. 1 is a block diagram of a range controller circuit in accordance with one embodiment of the invention.

FIG. 1 is a block diagram of a range controller circuit 10 in accordance with one embodiment of the invention. The range controller has a master counter 12 with an input 14 coupled to a recovered clock 16 from a phase lock loop. An output 18 of the master counter 12 is coupled to a reset logic 20. An output 22 of the reset logic 20 is coupled to an "S" input 24 of an RS latch 26. A second output 28 of the master counter 12 is coupled to the window comparison logic 30. The output 32 of the window comparison logic 30 is coupled to a link fault indicator flip flop 34. The link fault indicator flip flop 34 is clocked 36 by the recovered clock 16 and has a reset input coupled to the phase lock loop enabled signal 38 which also performs the function of an asynchronous link fault indicator flag. The output 40 of the link fault indicator flip flop 34 is a synchronous link fault indicator signal. Note that the RS latch may be replaced with a pair of flip flops.

Another input to the range controller 10 is the reference clock 42. The reference clock is an externally generated signal that is input as a solid reference. The reference clock 42 is coupled to an input 44 of a sample counter 46. The reference clock 42 also clocks a pair of reset flip flops 48. The output 50 of the reset flip flops is coupled to a reset 52 of the sample counter 46 and to an "R" input 54 of the RS latch 26. The "Q" output 56 of the RS latch 26 is coupled to the reset logic 20 and to a data input 58 of the reset flip flop 48. The output 60 of the sample counter 46 is coupled to the inner and outer window logic 62. The outputs 74 & 76 of the inner and outer window logic 62 is coupled to an inner window flip flop 78 and an outer window flip flop 80. The outputs 82 & 84 of the inner window 78 and outer window flip flops 80 are coupled to the comparison logic 30.

The reset logic 20 has an output 86 that indicates that a handshake failed which indicates that the reference clock 42 has been lost. The output 86 is coupled to a reference clock watchdog flip flop 88 that is clocked 90 by the recovered clock 16. The output 92 of the reference clock watchdog flip flop 88 is the reference clock watchdog flag. Note that all the blocks except the master counter 12 and the sample counter 46 may be considered a link fault indicator logic. The handshake reset logic 20, 26, 48 is has the function of reference clock detection.

In operation, the master counter 12 counts the recovered clock pulses 16. When the master counter 12 reaches a predetermined number the sample logic 30 compares the recovered count 28 with the inner and outer windows 82 & 84. Note that the inner and outer window 82 & 84 are generated from the sample counter 46 and as a result the recovered clock count 28 is compared with the reference count 60. When the link is in an in-lock state then the recovered clock count is compared with the outer window. If the recovered clock count is outside the outer window, then the link state changes to an out-of-lock state 40. If the next sample shows that the recovered clock count is inside the inner window, the link state changes to an in-lock state 40. This provides hysteresis to the out-of-lock detection. Note that the master counter 12 cycles and may have one bit fewer than the sample counter 46 to avoid ambiguities between the two counters.

When the master counter 12 has a count near its maximum or second predetermined count, a reset signal 22 is set. Note that the reset signal is usually a later count than the count that triggers the comparison between the recovered clock and the windows. The reset signal 22 changes the state of the "Q" output 56 of the RS latch 26. The output 56 is sampled by 58 the handshake flip flops 48. The flip flops 48 output 50 is changed by the reference clock 42. When the "R" input 54 changes the Q output 56 changes its state and the handshake is completed. When the reference clock 42 has been lost, the handshake flip flops 48 are not clocked. As a result, the Q output never changes state. If after a third predetermined count—usually one sequence of the master counter 12, the output Q has not changed the reference clock watchdog signal 86 is set. This signal 86 is latched by the flip flop 88. Once the reference clock 42 is received again it changes the state of the R input 54 and this resets the signal 86.

Figure 2:
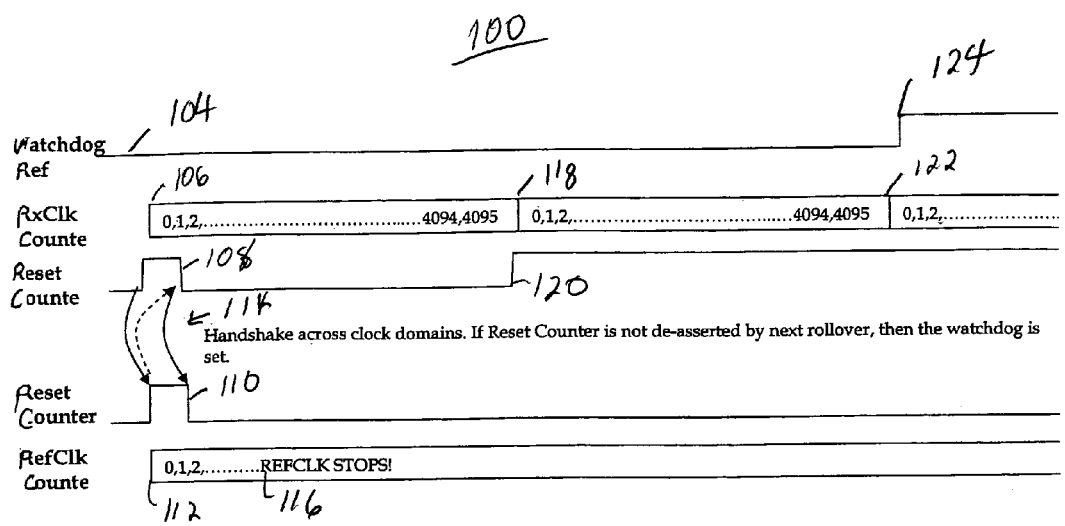
FIG. 2 is timing diagram of a reference clock watchdog flag in accordance with one embodiment of the invention.

FIG. 2 is timing diagram 100 of a reference clock watchdog flag in accordance with one embodiment of the invention. The top trace 102 is the watchdog signal 104. The next trace 106 is the recovered clock counter's count. The next trace 108 is the reset counter signal from the reset logic 20. The next trace 110 is the reset count' signal 50 that is coupled to the R input of the RS latch 26. The last trace 112 is the reference clock counter's count. At the start both counters 106 & 112 are set to zero and the handshake 114 works correctly. A little later the reference clock stops 116. At the beginning of the next cycle 118, the reset counter signal 108 goes high 120 but the reference reset count' signal 110 does not respond since the reference clock has stopped. At the next cycle 122, the watchdog signal 104 goes high 124 flagging the fact that the reference clock has been lost.

Thus there has been described a range controller that has a master counter coupled to a recovered clock. The recovered clock is used to clock the link fault indicator signal's status. Since the recovered clock almost always is running once it is acquired, there is almost no chance that a change in the status of the link fault indicator signal will not be latched. In addition, the range controller described herein has a new signal, a reference clock watchdog signal that indicates if the reference clock is not being received.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A range controller circuit, comprising:
   a master counter having a recovered clock input;
   a sampled counter having a reference clock input; and
   a link fault indicator logic coupled to an output of the master counter and an output the sampled counter.

2. The circuit of claim 1, wherein the link fault indicator logic has a reference clock presence indicator signal.

3. The circuit of claim 2, wherein the reference clock presence indicator signal is an output of a reference clock flip flop that is clocked by the recovered clock.

4. The circuit of claim 1, wherein the link fault indicator logic includes a handshake logic circuit.

5. The circuit of claim 4, wherein an output of the handshake logic circuit is coupled to a reference clock flip flop.

6. The circuit of claim 5, wherein the handshake logic circuit has a first input of a recovered clock reset count signal.

7. The circuit of claim 6, wherein the handshake logic circuit has a second input of a reference clock reset count' signal.

8. A method of operating a range controller, comprising the steps of:
   a) counting a recovered clock signal to form a recovered count;
   b) counting a reference clock signal to form a reference count; and
   c) when the recovered count is equal to a predetermined number, comparing the recovered count to the reference count.

9. The method of claim 8, further including the step of:
   d) when the recovered count is equal to a second predetermined number, greater than the first predetermined number, transmitting a reset clock signal to a reset circuit for the reference counter.

10. The method of claim 9, further including the steps of:
    e) when the reference reset count' signal is not detected in by a third predetermined number of counts after the reset count signal, setting a reference clock watchdog flag.

11. The method of claim 8, further including the step of:
    d) when the recovered count differs from the reference count by more than a predetermined number of counts, setting a link fault indicator flag.

12. The method of claim 11, wherein step (d) further includes the step of:
    d1) clocking the link fault indicator flag using the recovered clock signal.

13. A range controller circuit, comprising:
    a master counter having an input coupled to a recovered clock; and
    a link fault indicator logic coupled to an output of the master counter.

14. The circuit of claim 13, wherein a link fault indicator signal of the link fault indicator logic is clocked by the recovered clock.

15. The circuit of claim 14, further including a sampled counter having an input coupled to a reference clock.

16. The circuit of claim 15, wherein the link fault indicator logic has a reference clock watchdog signal output.

17. The circuit of claim 15, wherein the link fault indicator logic has a handshake logic circuit coupled between the master counter and the reference clock.

18. The circuit of claim 13, wherein the link fault indicator logic has an inner window logic circuit and an outer window logic circuit.

19. The circuit of claim 17, wherein an output of the handshake logic circuit is coupled to a reference clock latch.

20. The circuit of claim 19, wherein the reference clock latch is clocked by the recovered clock.

* * * * *